United States Patent
Simon et al.

(10) Patent No.: US 6,665,624 B2
(45) Date of Patent: Dec. 16, 2003

(54) GENERATING AND USING CALIBRATION INFORMATION

(75) Inventors: Thomas D. Simon, Marlborough, MA (US); Rajeevan Amirtharajah, Providence, RI (US)

(73) Assignee: Intel Corporation, Santa Clara, CA (US)

( * ) Notice: Subject to any disclaimer, the term of this patent is extended or adjusted under 35 U.S.C. 154(b) by 370 days.

(21) Appl. No.: 09/797,923

(22) Filed: Mar. 2, 2001

(65) Prior Publication Data

US 2002/0123853 A1 Sep. 5, 2002

(51) Int. Cl.[7] .................................................. G01D 18/00
(52) U.S. Cl. ........................ 702/89; 710/100; 710/300; 714/4; 714/43; 326/16; 326/86; 375/224; 375/257
(58) Field of Search ............................. 702/89; 710/100, 710/300; 714/4, 43; 326/16, 86; 375/224, 257

(56) References Cited

U.S. PATENT DOCUMENTS

| | | | | |
|---|---|---|---|---|
| 5,479,123 A | * | 12/1995 | Gist et al. ................... | 327/108 |
| 5,634,014 A | * | 5/1997 | Gist et al. ................... | 710/100 |
| 5,687,330 A | * | 11/1997 | Gist et al. ................... | 710/305 |
| 6,094,082 A | * | 7/2000 | Gaudet ........................ | 327/270 |
| 6,338,127 B1 | * | 1/2002 | Manning ..................... | 711/167 |
| 6,396,329 B1 | * | 5/2002 | Zerbe .......................... | 327/336 |
| 6,442,644 B1 | * | 8/2002 | Gustavson et al. ......... | 711/105 |
| 6,449,308 B1 | * | 9/2002 | Knight et al. ............... | 375/212 |
| 6,533,586 B2 | * | 3/2003 | Marketkar et al. .......... | 439/38 |
| 6,535,945 B1 | * | 3/2003 | Tobin et al. ................ | 710/305 |

* cited by examiner

Primary Examiner—John Barlow
Assistant Examiner—Anthony T. Dougherty
(74) Attorney, Agent, or Firm—Fish & Richardson P.C.

(57) ABSTRACT

Generating and using calibration information includes using a test circuit to generate calibration information that is representative of how changes in at least one variable affect operation of a first element of a controlled circuit and using the calibration information to provide control signals to the first element and to at least one other element of the controlled circuit to adjust operation of the first element and the other element to accommodate changes in the variable.

40 Claims, 14 Drawing Sheets

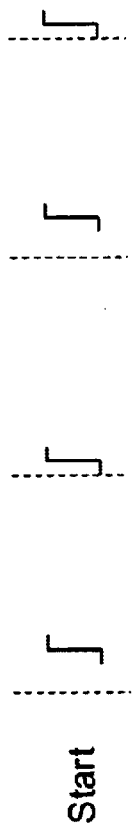
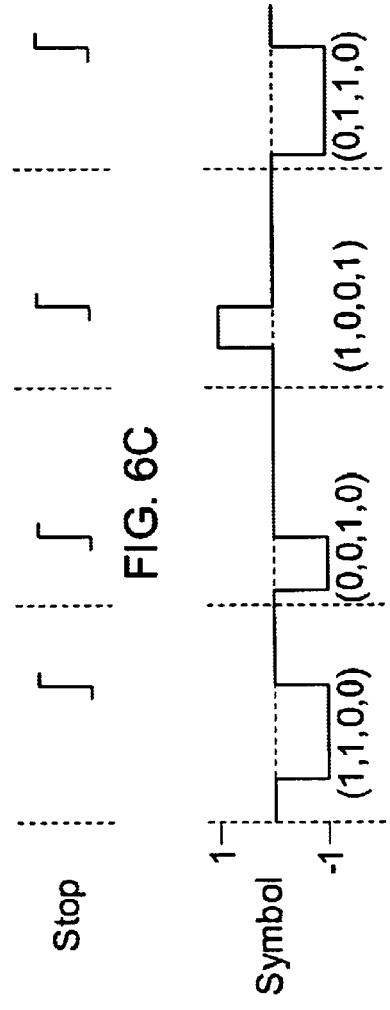
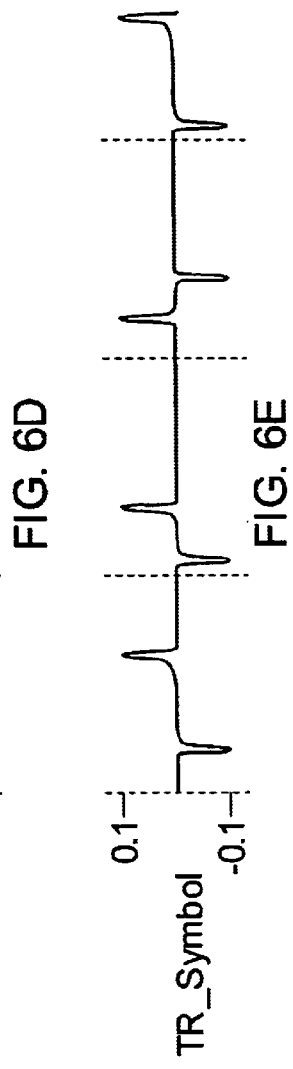
FIG. 6A FIG. 6B FIG. 6C FIG. 6D FIG. 6E

GENERATING AND USING CALIBRATION INFORMATION

BACKGROUND

This invention relates to generating and using calibration information.

Digital electronics systems, such as computers, must move data among their component devices at increasing rates to take full advantage of the higher speeds at which these component devices operate. For example, a computer may include one or more processors that operate at frequencies of a gigahertz (GHz) or more. The data throughput of these processors outstrips the data delivery bandwidth of conventional systems by significant margins.

The digital bandwidth (BW) of a communication channel may be represented as:

$$BW = F_s N_s.$$

Here, $F_s$ is the frequency at which symbols are transmitted on a channel and $N_s$ is the number of bits transmitted per symbol per clock cycle ("symbol density"). Channel refers to a basic unit of communication, for example a board trace in single ended signaling or the two complementary traces in differential signaling.

Conventional strategies for improving BW have focused on increasing one or both of the parameters $F_s$ and $N_s$. However, these parameters cannot be increased without limit. For example, a bus trace behaves like a transmission line for frequencies at which the signal wavelength becomes comparable to the bus dimensions. In this high frequency regime, the electrical properties of the bus must be carefully managed. This is particularly true in standard multi-drop bus systems, which include three or more devices that are electrically connected to each bus trace through parallel stubs.

Practical BW limits are also created by interactions between the BW parameters, particularly at high frequencies. For example, the greater self-induced noise associated with high frequency signaling limits the reliability with which signals can be resolved. This limits the opportunity for employing higher symbol densities.

Modulation techniques have been employed in some digital systems to encode multiple bits in each transmitted symbol, thereby increasing $N_s$. Use of these techniques has been largely limited to point-to-point communication systems, particularly at high signaling frequencies. Because of their higher data densities, encoded symbols can be reliably resolved only in relatively low noise environments. Transmission line effects limit the use of modulation in high frequency communications, especially in multi-drop environments.

Circuits that are used in communicating information over buses, like circuits used for other purposes, may benefit from calibration to accommodate variations in operating temperature, supply voltage, or fabrication process parameters, for example.

DESCRIPTION OF DRAWINGS

The present invention may be understood with reference to the following drawings, in which like elements are indicated by like numbers. These drawings are provided to illustrate selected embodiments of the present invention and are not intended to limit the scope of the invention.

FIGS. 6A, 6B, 6C, 6D, and 6E represent signals at various stages of data transmission of the bus system of FIG. 1.

DESCRIPTION

A mechanism for calibrating electronic circuitry is described here in the context of a high bandwidth communication technique that provides greater control over the frequency and encoding mechanisms employed to transfer data. In one aspect of the invention, a test circuit generates calibration information that is representative of how changes in at least one variable affect operation of a first element of a controlled circuit; and the calibration information is used to provide control signals to the first element and to at least one other element of the controlled circuit to adjust operation of the first element and the other element to accommodate changes in the variable.

Before proceeding to a discussion of the calibration technique, we describe an example of the circuitry to which it may be applied.

Figure 1:
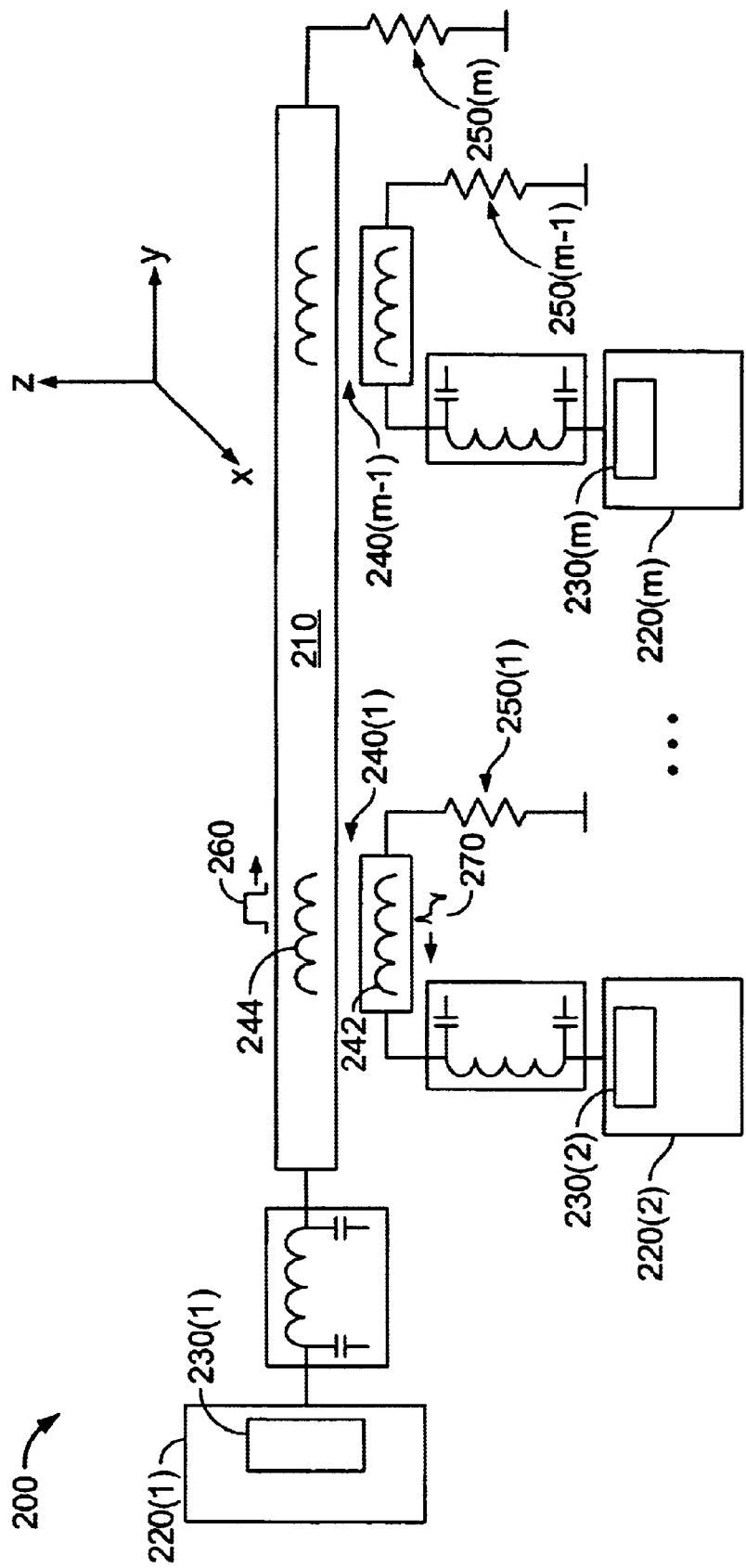
FIG. 1 is a block diagram representing an electromagnetically-coupled bus system.

FIG. 1 is a schematic representation of one embodiment of a multi-drop bus system 200. Signals are transmitted electromagnetically between a device, e.g. device 220(2), and bus 210 through electromagnetic coupler 240(1). In the following discussion, electromagnetic coupling refers to the transfer of signal energy through the electric and magnetic fields associated with the signal. In general, a signal transferred across electromagnetic coupler 240 is differentiated. For example, a positive signal pulse 260 on bus side 244 of electromagnetic coupler 240 becomes a positive/negative-going pulse 270 on device side 242 of electromagnetic coupler 240. The modulation scheme(s) employed in system 200 is selected to accommodate the amplitude attenuation and signal differentiation associated with electromagnetic couplers 240 without degrading the reliability of the communication channel.

For one embodiment of the invention, multi-drop bus system 200 is a computer system and devices 220 correspond to various system components, such as processors, memory modules, system logic and the like.

In the following discussion, various time-domain modulation schemes are used for purposes of illustration. The benefits of the present invention are not limited to the disclosed modulation schemes. Other time-domain modulation schemes, such as shape modulation (varying the number of edges in a pulse), narrowband and wideband frequency-domain modulation schemes, such as frequency modulation, phase modulation, and spread spectrum, or combinations of both time and frequency-domain modulation schemes (a pulse superposed with a high frequency sinusoid), are also suitable for use with this invention.

Figure 2:
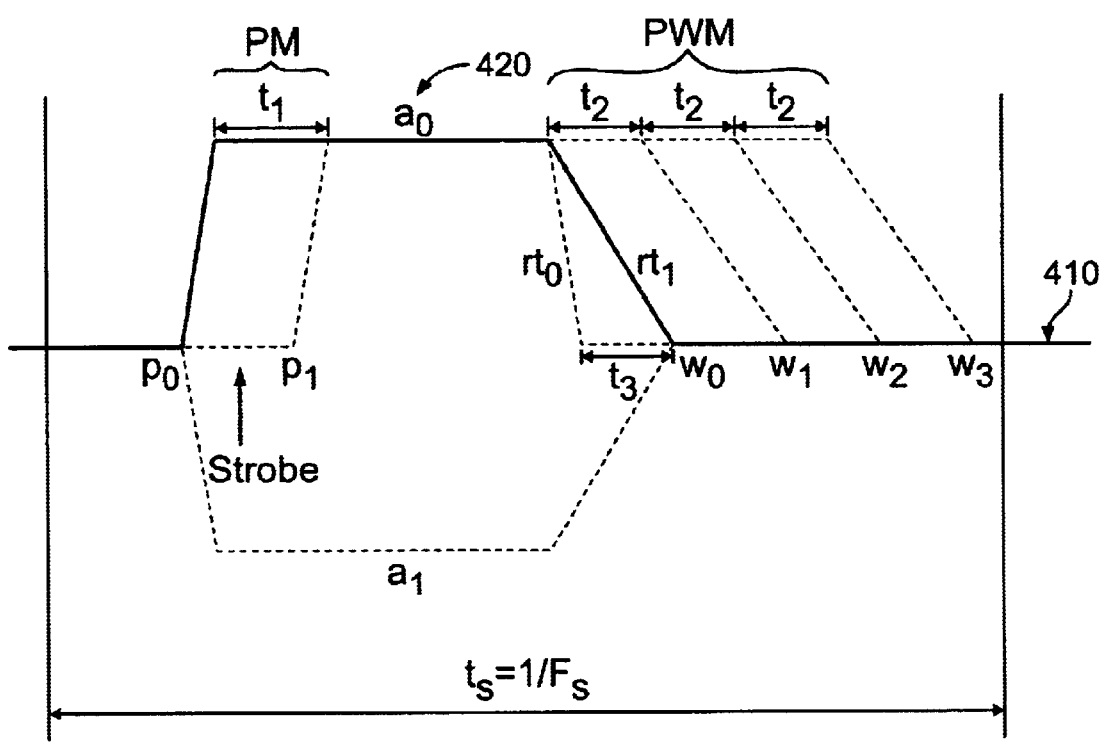
FIG. 2 is a schematic representation of a symbol that represents multiple bits of data.

FIG. 2 is a schematic representation of a signal 410 that illustrates the interplay between $F_s$, $N_s$, and various modulation schemes that may be employed to encode multiple data bits into a symbol. Signal 410 includes a modulated symbol 420 transmitted in a symbol period ($F_s^{-1}$). For purposes of illustration, phase, pulse-width, rise-time, and amplitude modulation schemes are shown encoding five bits of data ($N_s$=5) in symbol 420. The present invention may implement these modulation schemes as well as others, alone or in combination, to increase the bandwidth for a particular system. The modulation scheme(s) may be selected by considering the bit interval (see below), noise sources, and circuit limitations applicable to each modulation scheme under consideration, and the symbol period available for a given frequency.

In the following discussion, a "pulse" refers to a signal waveform having both a rising edge and a falling edge. For pulse-based signaling, information may be encoded, for example, in the edge positions, edge shapes (slopes), and signal amplitudes between edge pairs. The present invention is not limited to pulse-based signaling, however. Other signal waveforms, such as edge-based signaling and various types of amplitude, phase, or frequency-modulated periodic waveforms may be implemented as well. The following discussion focuses on modulation of pulse-based signaling schemes to elucidate various aspects of the present invention, but these schemes are not necessary to practice the invention. Considerations similar to those discussed below for pulse-based signaling may be applied to other signal waveforms to select an appropriate modulation scheme.

For signal 410, the value of a first bit (0 or 1) is indicated by where ($p_0$ or $p_1$) the leading edge of symbol 420 occurs in the symbol period (phase modulation or PM). The values of second and third bits are indicated by which of four possible widths ($W_0$, $W_1$, $W_2$, $W_3$) the pulse has (pulse-width modulation or PWM). The value of a fourth bit is indicated by whether the falling edge has a large ($rt_0$) or small ($rt_1$) slope (rise-time modulation or RTM), and the value of a fifth bit is indicated by whether the pulse amplitude is positive or negative ($a_0$, $a_1$, (amplitude modulation or AM). Bold lines indicate an actual state of symbol 420, and dashed lines indicate other available states for the described encoding schemes. A strobe is indicated within the symbol period to provide a reference time with which the positions of the rising and falling edges may be compared. The number of bits encoded by each of the above-described modulation schemes is provided solely for illustration. In addition, RTM may be applied to the rising and/or falling edges of symbol 420, and AM may encode bits in the magnitude and/or sign of symbol 420.

PM, PWM, and RTM are examples of time-domain modulation schemes. Each time-domain modulation scheme encodes one or more bits in the time(s) at which one or more events, such as a rising edge or a rising edge followed by a falling edge, occur in the symbol period. That is, different bit states are represented by different event times or differences between event times in the symbol period. A bit interval associated with each time-domain modulation scheme represents a minimum amount of time necessary to reliably distinguish between the different bit states of the scheme. The modulation schemes selected for a particular system, and the number of bits represented by a selected modulation scheme is determined, in part, by the bit intervals of the candidate modulation schemes and the time available to accommodate them, i.e. the symbol period.

In FIG. 2, $t_1$ represents a minimum time required to distinguish between $p_0$ and $p_1$ for a phase modulation scheme. One bit interval of duration $t_1$ is allocated within the symbol period to allow the pulse edge to be reliably assigned to $p_0$ or $p_1$. The value of $t_1$ depends on noise and circuit limitations that can interfere with phase measurements. For example, if the strobe is provided by a clock pulse, clock jitter may make the strobe position (time) uncertain, which increases the minimum interval necessary to reliably distinguish between $p_0$ and $p_1$. Various circuit limitations and solutions are discussed below in greater detail.

Similarly, one bit interval of duration $t_3$ is allocated within the symbol period to allow the two states ($rt_0$, $rt_1$) to be distinguished reliably. The size of $t_3$ is determined by noise and circuit limitations associated with rise time measurements. For example, rise times are differentiated by passing through coupler 240. Consequently, $t_3$ must be long enough to allow the measurement of a second derivative.

Three bit intervals of duration $t_2$ are allocated within the symbol period to allow the four states ($W_0$, $W_1$, $W_2$, $W_3$) to be reliably distinguished. The size of $t_2$ is determined by noise and circuit limitations associated with pulse width measurements. If pulse width is determined relative to a clock strobe, considerations regarding clock jitter may apply. If pulse width is determined relative to, e.g., the leading edge of a pulse, considerations such as supply voltage variations between the measurements of the leading and trailing edges may apply.

In general, the time needed to encode an n-bit value in a time-domain modulation scheme (i) that has a bit interval, $t_i$, is $(2^n-1) \cdot t_i$. If non-uniform bit intervals are preferred for noise or circuit reasons, the total time allotted to a modulation scheme is the sum of all of its bit intervals. When multiple time-domain modulation schemes are employed, the symbol period should be long enough to accommodate $\Sigma(2n-1) \cdot t_i$, plus any additional timing margins. Here, the summation is over all time-domain modulation schemes used. In the above example, the symbol period should accommodate $t_1 + t_3 + 3t_2$, plus any other margins or timings. These may include minimum pulse widths indicated by channel bandwidth, residual noise, and the like.

Using multiple encoding schemes reduces the constraints on the symbol time. For example, encoding five bits using pulse width modulation alone requires at least $31 \cdot t_2$. If $t_2$ is large enough, the use of the single encoding scheme might require a larger symbol period (lower symbol frequency) than would otherwise be necessary.

A minimum resolution time can also be associated with amplitude modulation. Unlike the time domain modulation schemes, amplitude modulation encodes data in pulse properties that are substantially orthogonal to edge positions. Consequently, it need not add directly to the total bit intervals accommodated by the symbol period. For example, amplitude modulation uses the sign or magnitude of a voltage level to encode data.

The different modulation schemes are not completely orthogonal, however. In the above example, two amplitude states (positive and negative) encode one bit, and the minimum time associated with this interval may be determined, for example, by the response time of a detector circuit to a voltage having amplitude, A. The pulse width should be at least long enough for the sign of A to be determined. Similarly, a symbol characterized by rise-time state $rt_1$ and width state $W_3$ may interfere with a next symbol characterized by phase state $p_0$. Thus, noise and circuit limitations (partly summarized in the bit intervals), the relative independence of modulation schemes, and various other factors are considered when selecting modulation schemes to be used with the present invention.

Figure 3B:
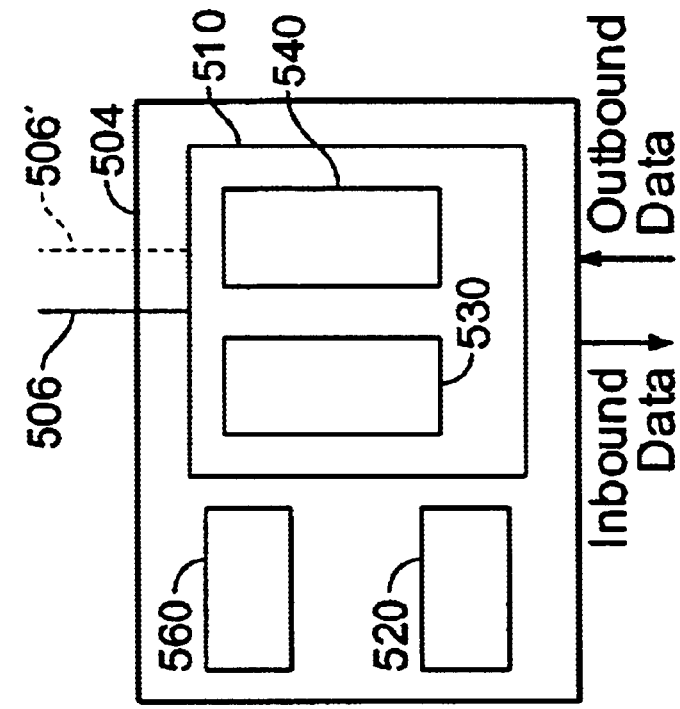
FIGS. 3A and 3B are block diagrams of an interface that is suitable for use with the present invention.
Figure 3A:
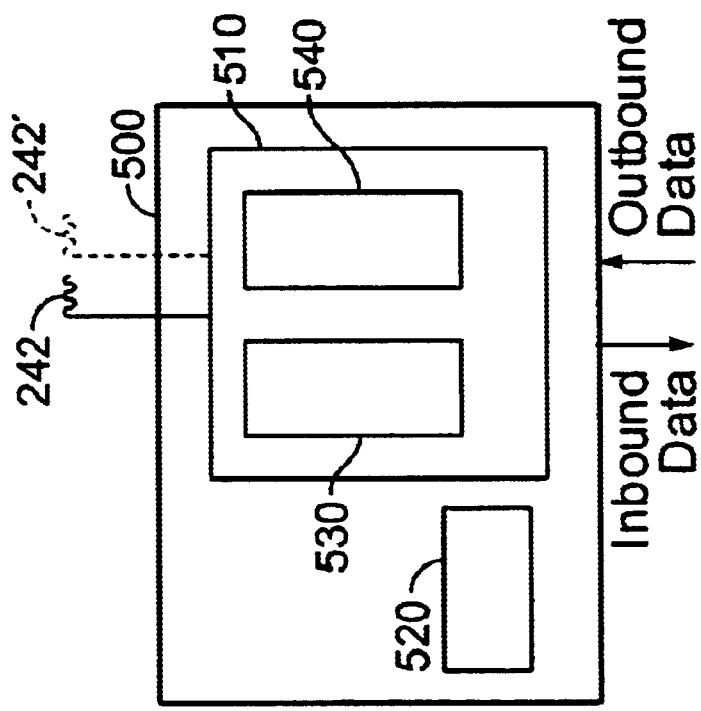

FIG. 3A is a block diagram of an embodiment 500 of interface 230 suitable for processing multi-bit symbols for devices 220(2)–220(m). For example, interface 500 may be used to encode outbound bits from, e.g., device 220(2) into a corresponding symbol for transmission on bus 210, and to decode a symbol received on bus 210 into inbound bits for use by device 220(2).

The disclosed embodiment of interface 230 includes a transceiver 510 and a calibration circuit 520. Also shown in FIG. 3A is device side component 242 of electromagnetic coupler 240 to provide a transferred waveform to transceiver 510. For example, the transferred waveform may be the differentiated waveform generated by transmitting pulse 420 across electromagnetic coupler 240. A device side component 242 is provided for each channel, e.g. bus trace, on which interface 230 communicates. A second device side component 242' is indicated for the case in which differential signaling is employed.

Transceiver 510 includes a receiver 530 and a transmitter 540. Receiver 530 recovers the bits encoded in the transferred waveform on device side component 242 of electromagnetic coupler 240 and provides the recovered bits to the device associated with interface 230. Embodiments of receiver 530 may include an amplifier to offset the attenuation of signal energy on transmission across electromagnetic 240. Transmitter 540 encodes data bits provided by the associated device into a symbol and drives the symbol onto device side 242 of electromagnetic coupler 240.

Calibration circuit 520 manages various parameters that may impact the performance of transceiver 510. For one embodiment of interface 230, calibration circuit 520 may be used to adjust termination resistances, amplifier gains, or signal delays in transceiver 510, responsive to variations in process, temperature, voltage, and the like. The calibration circuit 520 is discussed further below.

FIG. 3B is a block diagram of an embodiment 504 of interface 230 that is suitable for processing encoded symbols for a device that is directly connected to the communication channel. For example, in system 200 (FIG. 1), device 220(1) may represent the system logic (e.g., controller) or chipset of a computer system that is directly connected to a memory bus (210), and devices 220(2)–220(m) may represent memory modules for the computer system. Accordingly, a DC connection 506 is provided for each channel or trace on which interface 504 communicates. A second DC connection 506' (per channel) is indicated for the case in which differential signaling is employed. Interface 504 may include a clock synchronization circuit 560 to account for timing differences in signals forwarded from different devices 220(2)–220(m) and a local clock.

Figure 4:
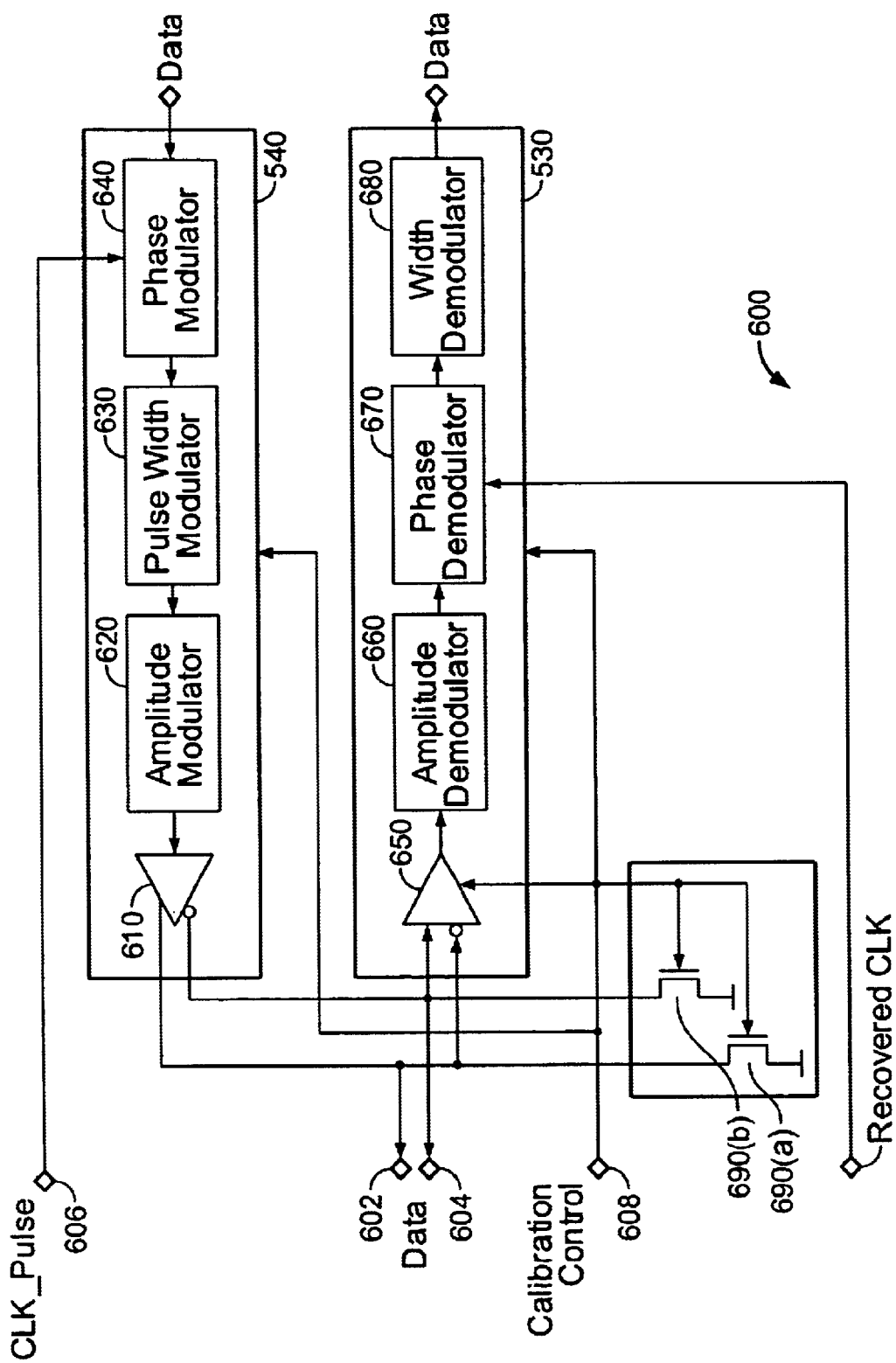
FIG. 4 is a block diagram of a transceiver module.

FIG. 4 is a block diagram representing an embodiment 600 of transceiver 510 that is suitable for handling waveforms in which data bits are encoded using phase, pulse-width and amplitude modulation, and the strobe is provided by a clock signal. Transceiver 600 supports differential signaling, as indicated by data pads 602, 604, and it receives calibration control signals from, e.g., calibration circuit 520, via control signals 608.

For the disclosed embodiment of transceiver 510, transmitter 540 includes a phase modulator 640, a pulse-width modulator 630, an amplitude modulator 620 and an output buffer 610. Output buffer 610 provides inverted and non-inverted outputs to pads 602 and 604, respectively, to support differential signaling. A clock signal is provided to phase modulator 640 to synchronize transceiver 510 with a system clock. The disclosed configuration of modulators 620, 630, and 640 is provided only for purposes of illustration. The corresponding modulation schemes may be applied in a different order or two or more schemes may be applied in parallel.

The disclosed embodiment of receiver 530 includes an amplifier 650, an amplitude demodulator 660, a phase demodulator 670, and a pulse-width demodulator 680. The order of demodulators 660, 670, and 680 is provided for illustration and is not required to implement the present invention. For example, various demodulators may operate on a signal in parallel or in an order different from that indicated.

Devices 690(a) and 690(b) (generically, "device 690") act as on-chip termination impedances, which in one embodiment of this invention are active while interface 230 is receiving. The effectiveness of device 690 in the face of, e.g., process, temperature, and voltage variations may be aided by calibration circuit 520. For transceiver 600, device 690 is shown as an N device, but the desired functionality may be provided by multiple N and/or P devices in series or in parallel. The control provided by calibration circuit 520 may be in digital or analog form, and may be conditioned with an output enable.

Figure 5A:
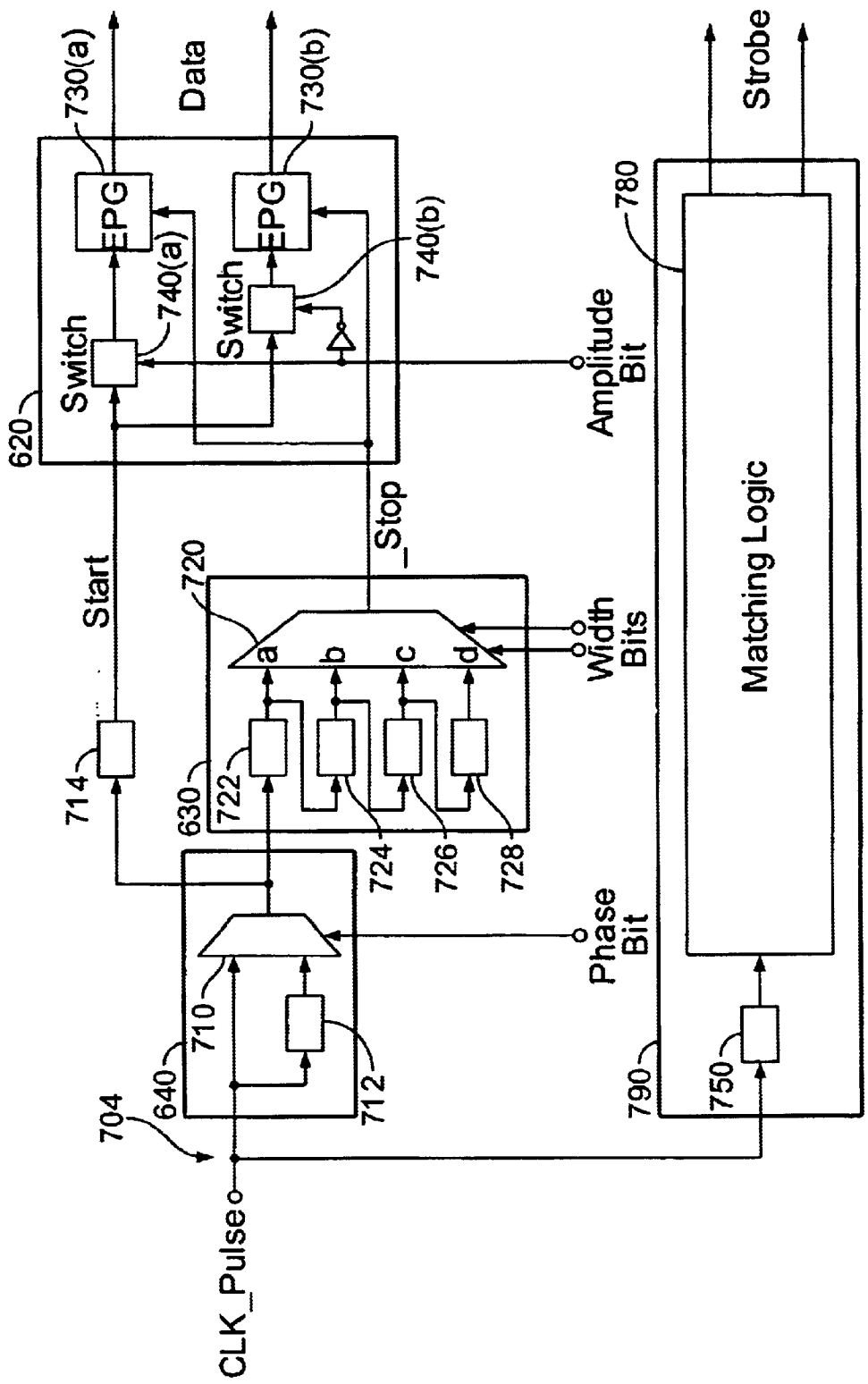
FIGS. 5A, 5B, 5C, and 5D are circuit diagrams for various components of the transmitter of FIG. 4.

FIG. 5A is a circuit diagram of one embodiment of transmitter 540 and its component modulators 620, 630, 640. Also shown is a strobe transmitter 790 suitable for generating a strobe signal, which may be transmitted via bus 210. For one embodiment of system 200, two separate strobes are provided. One strobe is provided for communications from device 220(1) to devices 220(2) through 220(m), and another strobe is provided for communications from devices 220(2) through 220(m) back to device 220(1).

The disclosed embodiment of transmitter 540 modulates a clock signal (CLK_PULSE) to encode four outbound bits per symbol period. One bit is encoded in the symbol's phase (phase bit), two bits are encoded in the symbol's width (width bits) and one bit is encoded in the symbol's amplitude (amplitude bit). Transmitter 540 may be used to generate a differential symbol pulse per symbol period, and strobe transmitter 790 may be used to generate a differential clock pulse per symbol period.

Phase modulator 640 includes a MUX 710 and delay module (DM) 712. MUX 710 receives a delayed version of CLK_PULSE via DM 712 and an undelayed version of CLK_PULSE from input 704. The control input of MUX 710 transmits a delayed or undelayed first edge of CLK_PULSE responsive to the value of the phase bit. In general, a phase modulator 640 that encodes p phase bits may select one of $2^p$ versions of CLK_PULSE subject to different delays. For the disclosed embodiment, the output of phase modulator 640 indicates the leading edge of symbol 420 and serves as a timing reference for generation of the trailing edge by width modulator 630. A delay-matching block (DMB) 714 is provided to offset circuit delays in width modulator 630 (such as the delay of MUX 720) which might detrimentally impact the width of symbol 420. The output of DMB 714 is a start signal (START), which is provided to amplitude modulator 620 for additional processing.

Width modulator 630 includes DMs 722, 724, 726, 728, and MUX 720 to generate a second edge that is delayed relative to the first edge by an amount indicated by the width bits. The delayed second edge forms a stop signal (_STOP) that is input to amplitude modulator 620 for additional processing. For the disclosed embodiment of transmitter 540, two bits applied to the control input of MUX 720 select one of four different delays for the second edge, which is provided at the output of MUX 720. Inputs a, b, c, and d of MUX 720 sample the input signal, i.e. the first edge, following its passage through DMs 722, 724, 726, and 728, respectively. If the width bits indicate input c, for example, the second edge output by MUX 720 is delayed by DM 722+DM 724+DM 726 relative to the first edge.

Amplitude modulator 620 uses START and _STOP to generate a symbol pulse having a first edge, a width, and a polarity indicated by the phase, width, and amplitude bits, respectively, provided to transmitter 540 for a given symbol period. Amplitude modulator 620 includes switches 740(a) and 740(b) which route START to edge-to-pulse generators (EPG) 730(a) and 730(b), respectively, depending on the state of the amplitude bit. Switches 740 may be AND gates, for example. _STOP is provided to second inputs of EPGs 730(a) and 730(b) (generically, EPG 730). On receipt of START, EPG 730 initiates a symbol pulse, which it terminates on receipt of _STOP. Depending on which EPG 730 is activated, a positive or a negative going pulse is provided to the output of transmitter 540 via differential output buffer 610.

Strobe transmitter 790 includes DM 750 and matching logic block 780. DM 750 delays CLK_PULSE to provide a strobe signal that is suitable for resolving the data phase choices $p_0$ and $p_1$ of symbol 420. For one embodiment of strobe transmitter 790, DM 750 positions the strobe evenly between the phase bit states represented by $p_0$ and $p_1$ (FIG. 2). The strobe is used by, e.g., receiver 530 to demodulate phase by determining if the leading edge of data arrives before or after the strobe. DM 750 of strobe transmitter 790 thus corresponds to phase modulator 640 of data transmitter 540. Matching logic block 780 duplicates the remaining circuits of transmitter 540 to keep the timing of the strobe consistent with the data, after DM 750 has fixed the relative positioning.

In general, DM 750 and matching logic block 780 duplicate for the strobe the operations of transmitter 540 on data signals at the level of physical layout. Consequently, this delay matching is robust to variations in process, temperature, voltage, etc. In addition, the remainder of the communication channel from the output of transmitter 540, through board traces, electromagnetic coupler 240, board traces on the other side of coupler 240, and to the inputs of receiver 530 at the receiving device, may be matched in delays between data and strobe in order to keep the chosen relative timing. However, the matching of delays is one embodiment described for illustrative purposes and is not necessary to practice this invention. For example, if the circuits and remainder of the channel do not maintain matched data to strobe delays, receivers may calibrate for the relative timing of the strobe or even compensate for the absence of a strobe by recovering the timing from appropriately encoded data.

Figure 5C:
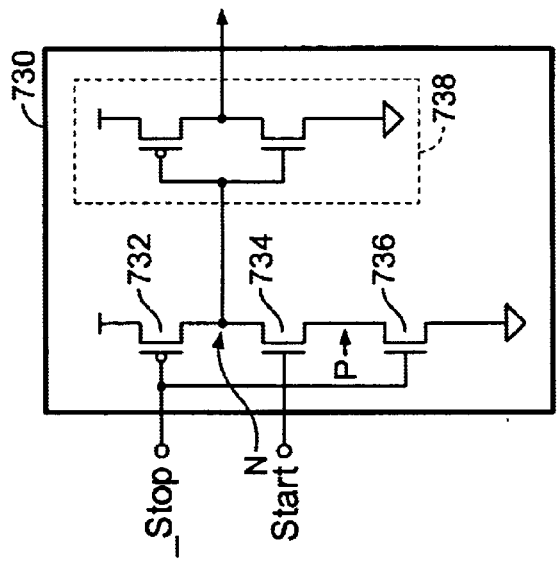
Figure 5B:
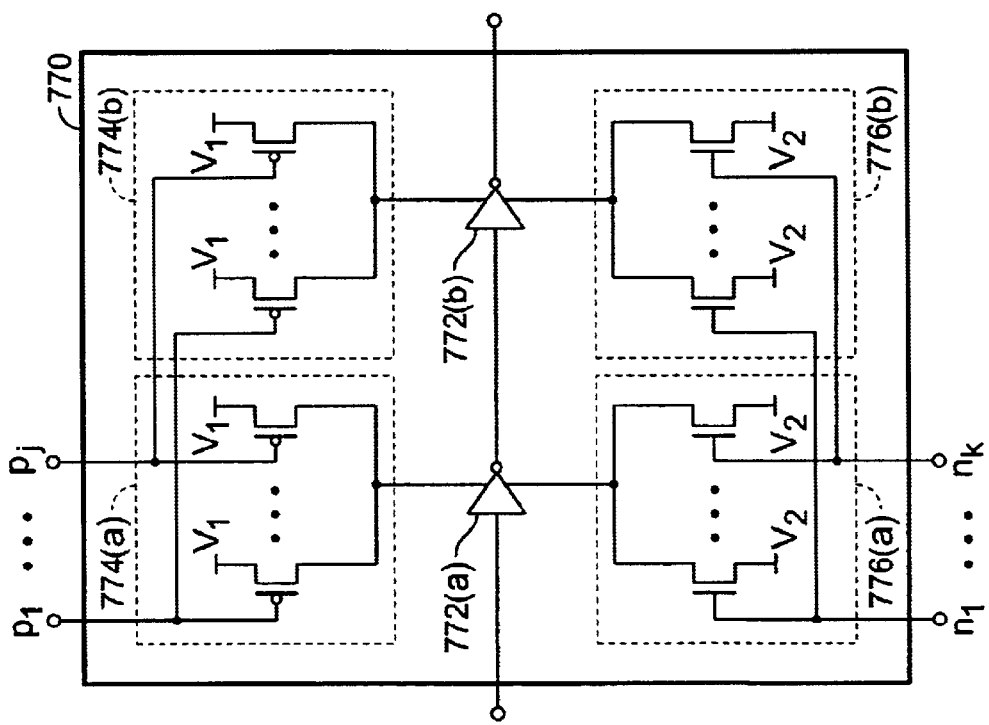

FIG. 5B is a schematic diagram of one embodiment of a programmable delay module (DM) 770 that is suitable for use with the present invention. For example, one or more DMs 770 may be used for any of DMs 712, 722, 724, 726, 728, and 750 in the disclosed embodiment of transmitter 540 to introduce programmable delays in START and _STOP. DM 770 includes inverters 772(a) and 772(b) that are coupled to reference voltages $V_1$ and $V_2$ through first and second transistor sets 774(a), 774(b) and 776(a), 776(b), respectively. Reference voltages $V_1$ and $V_2$ may be the digital supply voltages in some embodiments. Programming signals, $P_1$–$P_j$ and $n_1$–$n_k$, applied to transistor sets 774(a), 774(b) and 776(a), 776(b), respectively, alter the conductances seen by inverters 772(a) and 722(b) and, consequently, their speeds. This topology is known as a current starved inverter. As discussed below in greater detail, calibration circuit 520 may be used to select programming signals, $p_1$–$p_j$ and $n_1$–$n_k$, for inverters 772(a) and 772(b).

FIG. 5C is a schematic diagram of one embodiment of EPG 730 that is suitable for use with the present invention. The disclosed embodiment of EPG 730 includes transistors 732, 734, and 736 and inverter 738. The gate of N-type transistor 734 is driven by START. A positive-going edge on START indicates the beginning of a symbol pulse. The gates of P and N-type transistors 732 and 736, respectively, are driven by _STOP, which, for EPG 730(a) and 730(b) in FIG. 5A, is a delayed, inverted copy of START. A negative-going edge on _STOP indicates the end of a symbol pulse. When _STOP is high, transistor 732 is off and transistor 736 is on. A positive-going edge on START turns on transistor 734, pulling node N low and generating a leading edge for a symbol pulse at the output of EPG 730. A subsequent negative-going edge on _STOP, turns off transistor 736 and turns on transistor 732, pulling node N high and terminating the symbol pulse.

For a given symbol pulse, START may be deasserted (negative-going edge) before or after the corresponding _STOP is asserted. For example, the disclosed embodiment of transmitter 540 is timed with CLK_PULSE, and higher symbol densities may be obtained by employing narrow CLK_PULSEs. The widths of START and _STOP are thus a function of the CLK_PULSE width, while the separation between START and _STOP is a function of the width bits. The different possible relative arrivals of the end of START and beginning of _STOP may adversely impact the modulation of symbol 420 by the width bits. Specifically, transistor 734 may be on or off when a negative-going edge of _STOP terminates the symbol pulse. Node N may thus either be exposed to the parasitic capacitances at node P through transistor 734, or not. This variability may affect the delay of the trailing symbol edge through EPG 730 in an unintended way.

Figure 5D:
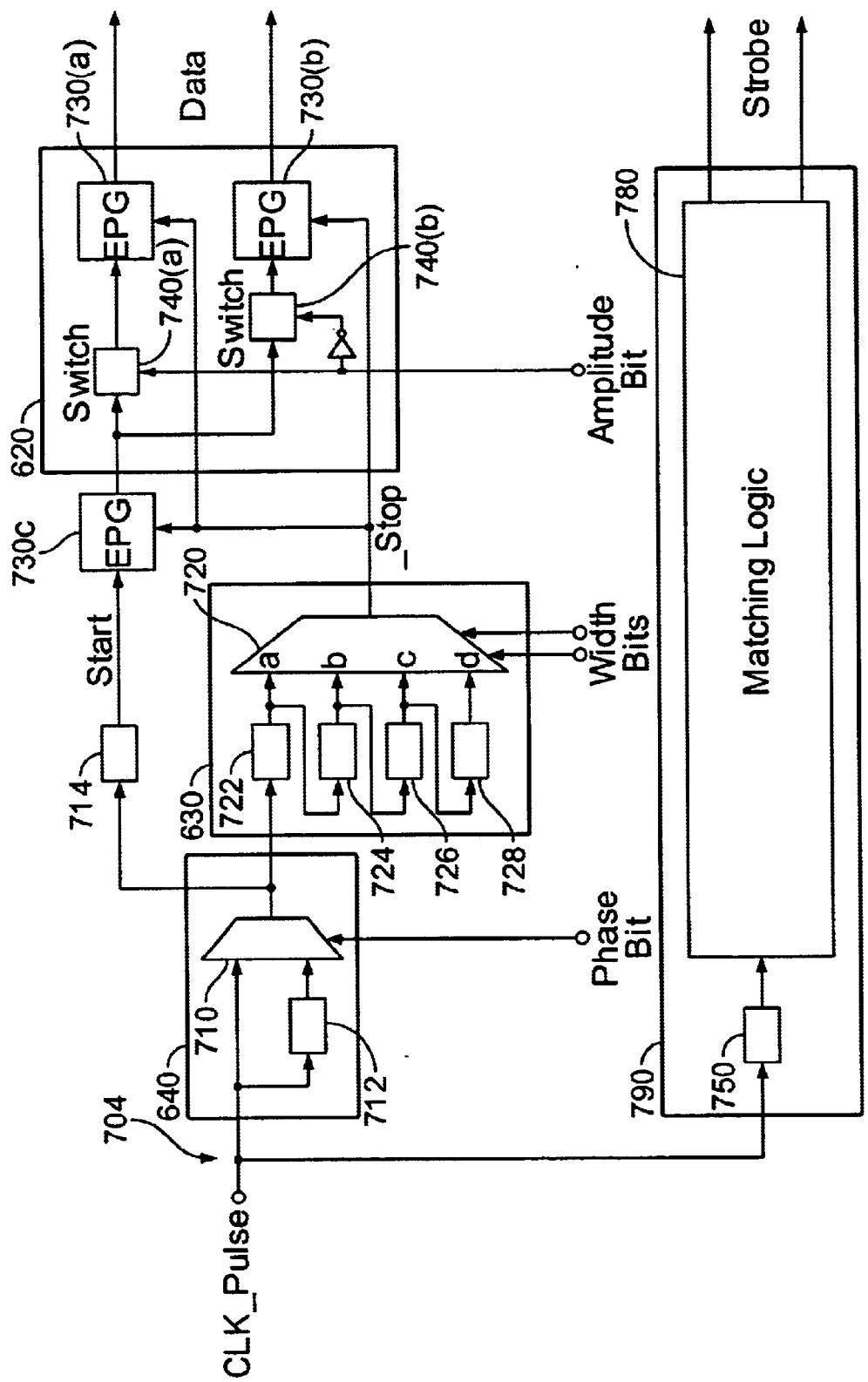

FIG. 5D is a schematic diagram of an alternative embodiment of transmitter 540 that includes an additional EPG 730(c). EPG 730(c) reshapes START to ensure a consistent timing which avoids the variability described above. Namely, the modified START is widened so that it always ends after _STOP begins. This is done by generating a new START whose beginning is indicated by the original START but whose end is indicated by the beginning of _STOP, instead of the width of CLK_PULSE. Note also that, in the alternative embodiment shown in FIG. 5D, the sum of the delays through delay matching block 714 and EPG 730(c) must match the unintended delays in width modulator 630.

FIGS. 6A–6E show CLK_PULSE, START, STOP, SYMBOL, and TR_SYMBOL, respectively, for one embodiment of system 200. Here, TR_SYMBOL represents the form of SYMBOL following transmission across electromagnetic coupler 240. The smaller amplitude of TR_SYMBOL relative to SYMBOL is roughly indicated by the scale change between the waveforms of FIGS. 6D and 6E. TR_SYMBOL represents the signal that is decoded by interface 230 to extract data bits for further processing by device 220. The four outbound bits encoded by each SYMBOL are indicated below the corresponding SYMBOL in the order (p, $W_1$, $W_2$, a).

Figure 7A:
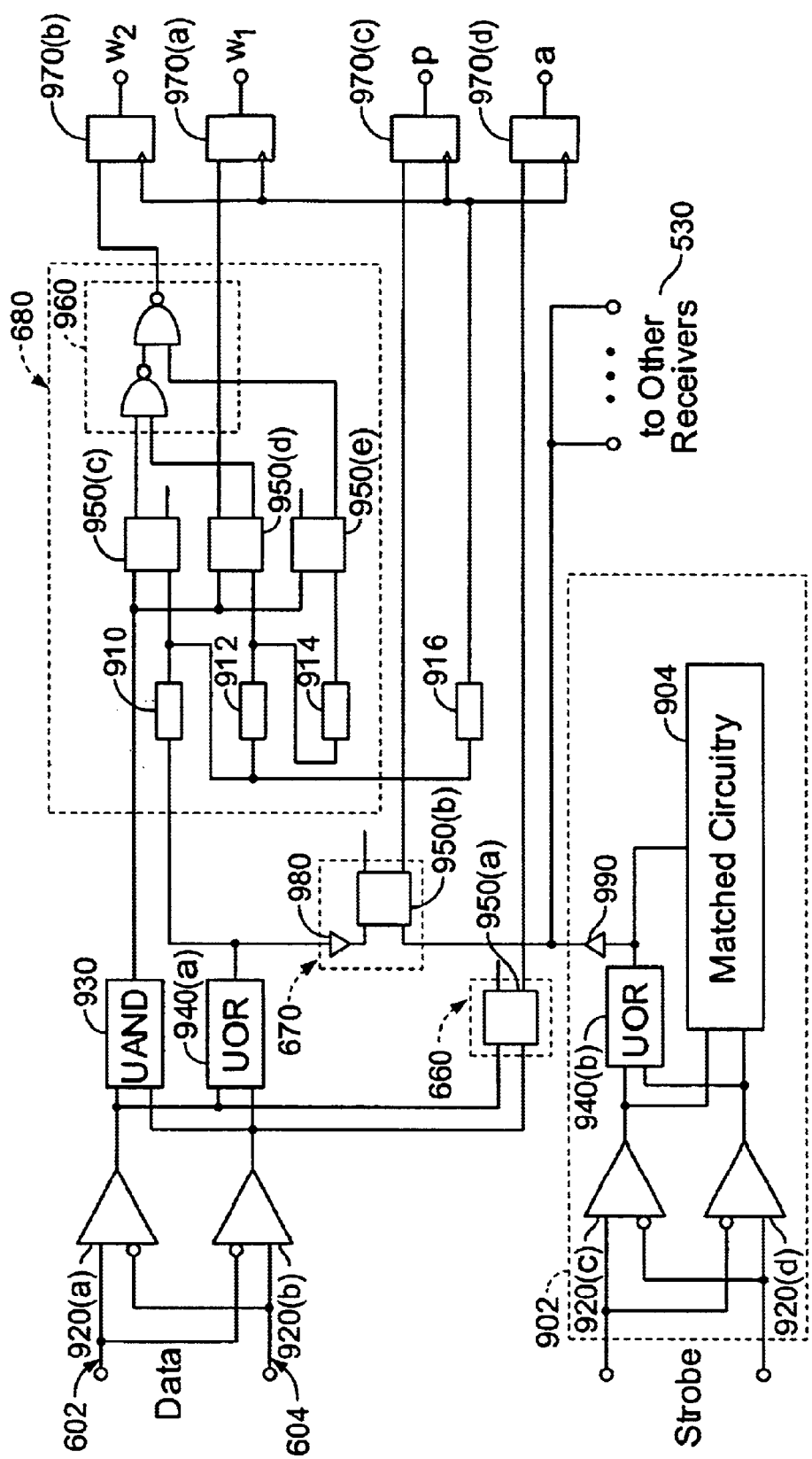
FIGS. 7A, 7B, 7C, 7D, and 7E are circuit diagrams for various components of the receiver of FIG. 4.

FIG. 7A is a schematic diagram representing one embodiment of receiver 530 that is suitable for use with the present invention. The disclosed embodiment of receiver 530 processes differential data signals. FIG. 7A also shows a strobe receiver 902, which is suitable for processing a differential strobe signal. Strobe receiver 902 may provide delay matching for receiver 530 similar to that discussed above. Receiver 530 and strobe receiver 902 may be used, for example, in system 200 in conjunction with the embodiments of transmitter 540 and strobe transmitter 790 discussed above.

The disclosed embodiment of receiver 530 includes differential to single-ended amplifiers 920(a) and 920(b) which compensate for the energy attenuation associated with electromagnetic coupler 240. Amplifiers 920(a) and 920(b) produce digital pulses in response to either positive or negative pulses on the transferred signal (TR_SYMBOL in FIG. 6E) and its complement, e.g., the signals at inputs 602 and 604. In addition to amplification, amplifiers 920 may latch their outputs with appropriate timing signals to provide sufficient pulse widths for succeeding digital circuits.

Matching strobe receiver 902 similarly amplifies the accompanying differential strobe signal. For the disclosed embodiment, the received strobe is used to decode phase information in data symbol 420. Strobe receiver 902 includes differential to single-ended amplifiers 920(c) and 920(d) and matched circuitry 904. Matched circuitry 904 replicates much of the remaining circuitry in receiver 530 to match delays for data and strobe signals, similar to the matching of transmitter 540 and strobe transmitter 790. One embodiment of strobe receiver 902 includes circuits that correspond to phase demodulator 670 and width demodulator 680 with some minor modifications. For example, strobe buffer 990 buffers the received strobe for distribution to multiple receivers 530, up to the number of channels in, e.g., bus 210. Strobe buffer 990 may be large, depending on the number of receivers it drives. Data buffer 980 corresponds to strobe buffer 990. To save area, data buffer 980 need not be an exact replica of strobe buffer 990. The delays can also be matched by scaling down both data buffer 980 and its loading proportionately, relative to their counterparts in strobe receiver 902.

Figure 7C:
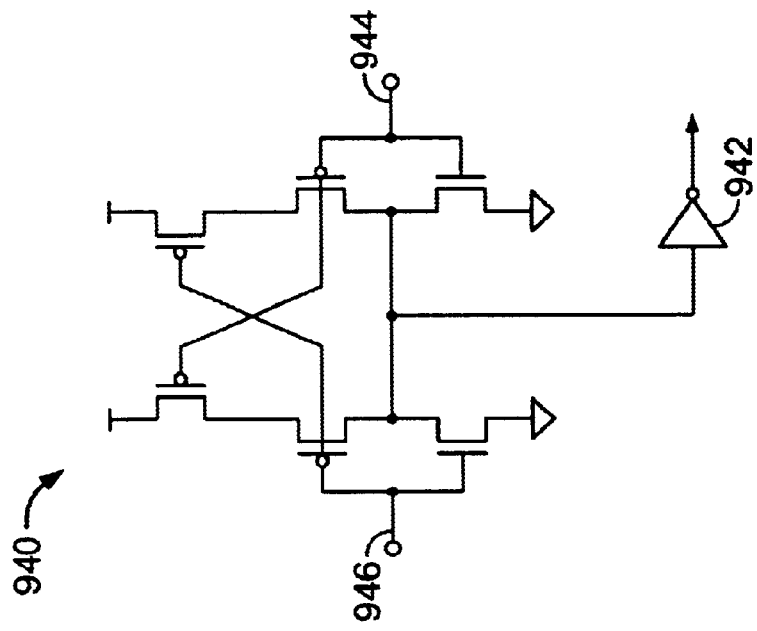
Figure 7B:
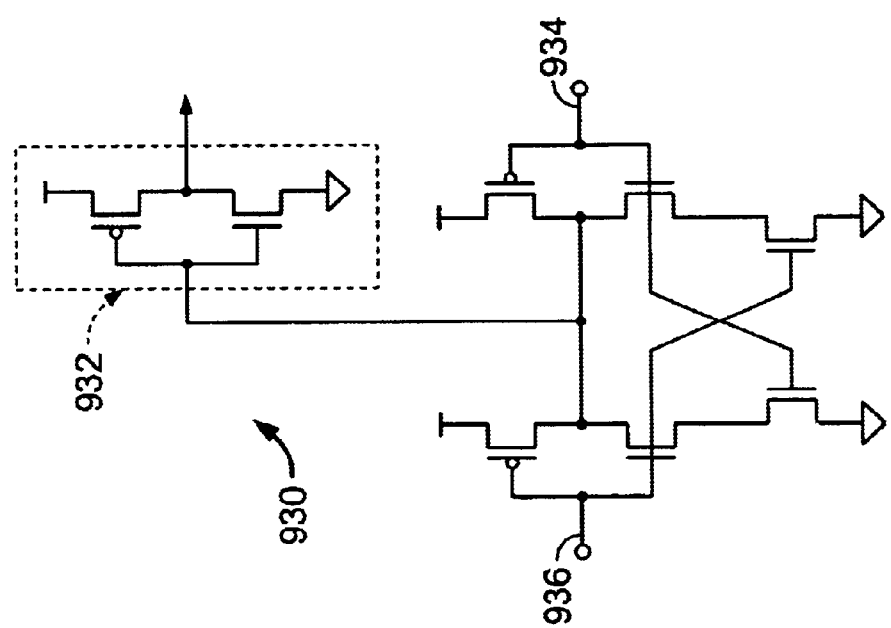

Uni-OR gate (UOR) 940(a) combines the outputs of amplifiers 920(a) and 920(b) to recover the first edge of TR_SYMBOL. The name uni-OR indicates that the propagation delay through gate 940 is uniform with respect to the two inputs. An embodiment of UOR 940 is shown in FIG. 7C. Similarly, uni-AND gate (UAND) 930 recovers the second edge of TR_SYMBOL. An embodiment of UAND 930 is shown in FIG. 7B.

Figure 7D:
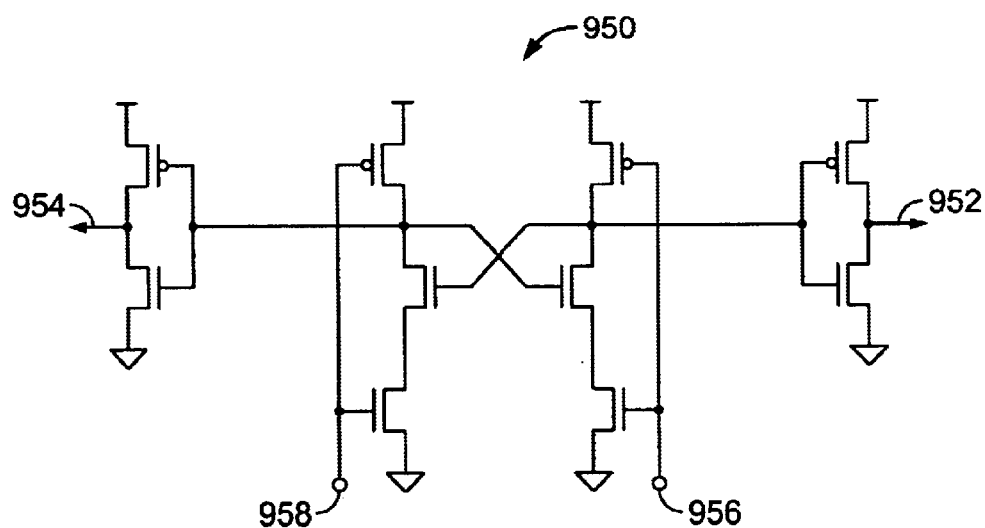

The disclosed embodiment of phase demodulator 670 includes an arbiter 950(b) (generically, "arbiter 950") and data buffer 980. Arbiter 950(b) compares the first edge recovered from the transferred symbol by UQR 940(a) with the corresponding edge from the recovered strobe by UOR 940(b), respectively, and sets a phase bit according to whether the recovered first edge of the symbol leads or follows the first edge of the strobe. An embodiment of arbiter 950 is shown in FIG. 7D. An output 952 goes high if input 956 goes high before input 958. Output 954 goes high if input 958 goes high before input 956.

Figure 7E:
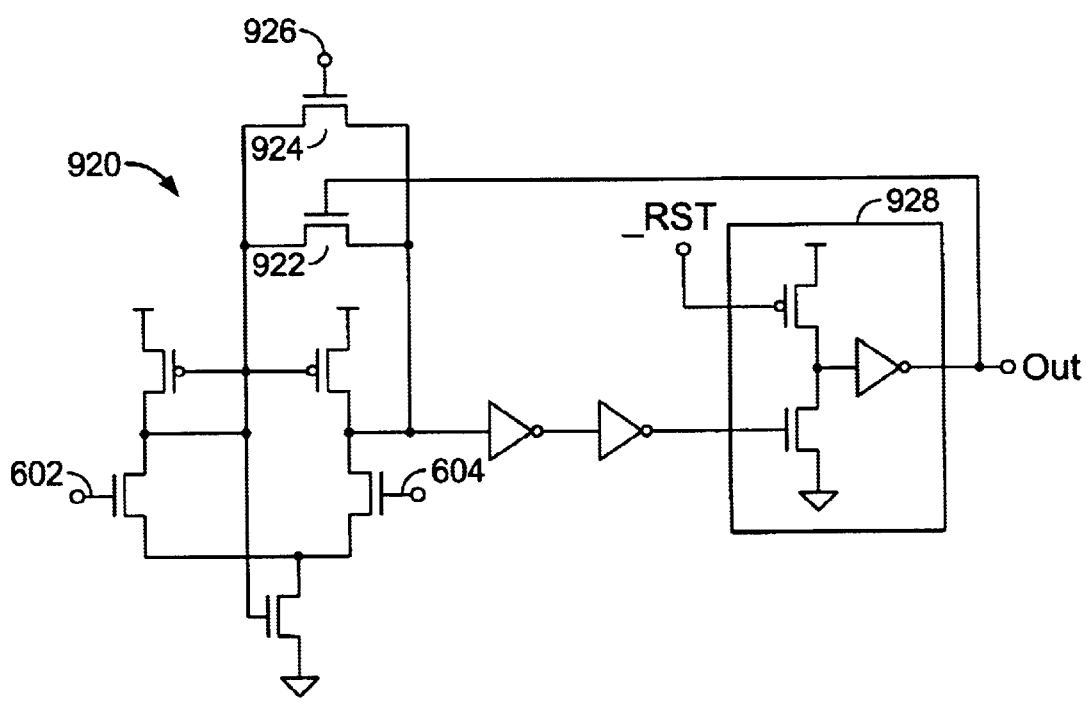

FIG. 7E is a circuit diagram representing one embodiment of amplifier 920. The disclosed embodiment of amplifier 920 includes a reset equalization device 922, a gain control device 924, and a pre-charged latch 928. Reset device 922 speeds up the resetting of amplifier 920 after a detected pulse, in preparation for the next symbol period. Gain control device 924 compensates the gain of amplifier 920 for variations in process, voltage, temperature, and the like. A control signal 926 may be provided by calibration circuit 520. More generally, device 924 may be multiple devices connected in series or parallel, and the control signal 926 may be several signals (analog or digital) produced by calibration circuit 520. Pre-charged latch 928 reshapes received pulses for the convenience of succeeding circuits. Resulting output pulse widths are determined by a timing signal, _RST. For one embodiment of amplifier 920, _RST is produced by DM 916 (FIG. 7A), along with other timing signals used in receiver 530. It is possible for pre-charged latch 928 and signal _RST to be in inconsistent states, due to power-on sequences or noise. Additional circuitry may be used to detect and correct such events.

The disclosed embodiment of amplitude demodulator 660 includes an arbiter 950(a) which receives the amplified transferred signals from amplifiers 920(a) and 920(b). Arbiter 950(a) sets an amplitude bit according to whether the output of amplifier 920(a) or 920(b) pulses first.

The disclosed embodiment of width demodulator 680 includes delay modules (DMs) 910, 912, 914, arbiters 950 (c), 950(d), 950(e), and decoding logic 960. The recovered first symbol edge is sent through DMs 910, 912, and 914 to generate a series of edge signals having delays that replicate the delays associated with different symbol widths. For one embodiment of the invention, DMs 910, 912, and 914 may be implemented as programmable delay modules (FIG. 5B). Arbiters 950(c), 950(d), and 950(e) determine the (temporal) position of the second edge with respect to the generated edge signals. Decoding logic 960 maps this position to a pair of width bits.

Latches 970(a), 970(b), 970(c), and 970(d) receive first and second width bits, the phase bit, and the amplitude bit, respectively, at their inputs, and transfer the extracted (inbound) bits to their outputs when clocked by a clocking signal. For the disclosed embodiment of receiver 530, the latches are clocked by sampling a signal from the delay chain of width demodulator 680 through the extra delay of DM 916. This latching synchronizes the demodulated bits to the accompanying strobe timing. In addition, a device 220 may require a further synchronization of the data to a local clock, e.g. clock synchronization circuit 560 in FIG. 3B. Persons skilled in the art and having the benefit of this disclosure will appreciate that this can be done in any number of different ways.

The various components in an embodiment of interface 230 include a number of circuit elements that may be adjusted to compensate for process, voltage, temperature variations and the like. For example, compensation may entail adjusting the delay provided by a programmable delay module (DM 770), the gain provided by an amplifier (amplifier 920), or the termination resistance (device sets 690(a) and 690(b)).

Figure 8:
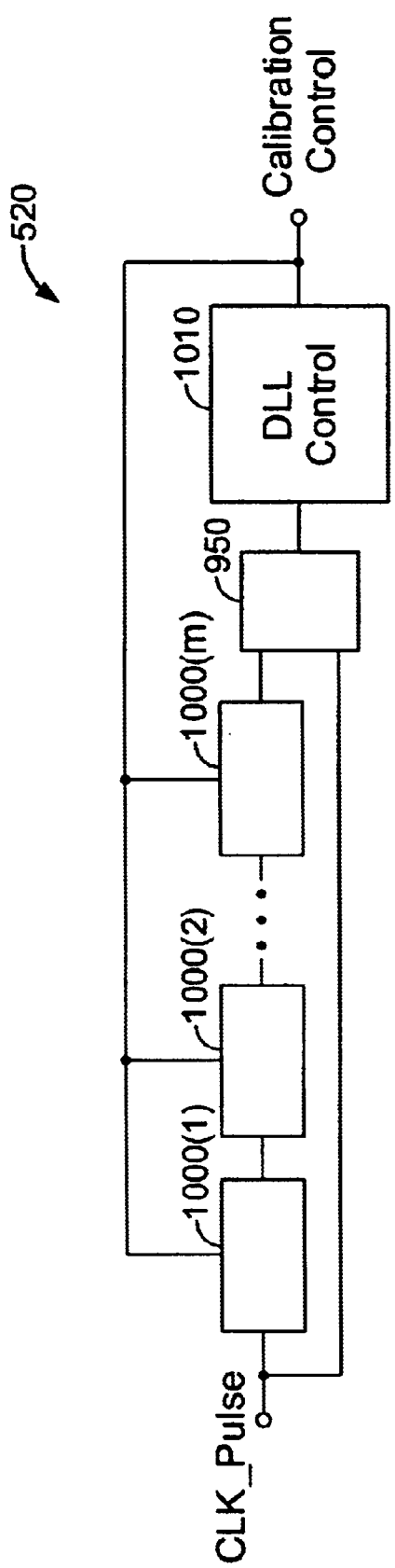
FIG. 8 is a block diagram representing a calibration circuit.

FIG. 8 shows an embodiment of a calibration circuit 520. The purpose of calibration is to use feedback to measure and compensate for variable process, temperature, voltage, and the like. The embodiment of calibration circuit 520 shown in FIG. 8 is a delay-locked loop (DLL). A clock signal (CLK_PULSE) is delayed by series-connected DMs 1000(1)–1000(m). The number of DMs is chosen so that the sum of the delays can be set to match one period of CLK_PULSE.

Arbiter 950 is used to detect when the sum of the delays through DMs 1000 is less than, equal to, or more than one clock period. DLL control 1010 cycles through delay control settings until the sum of the delays matches one clock period.

Effects such as thermal noise in the arbiter 950 and clock jitter may randomly move a clock edge away from its ideal position. Such effects may corrupt the calibration by causing the DLL to lock on a false clock period. To reduce the impact of such effects, in one embodiment, the DLL control 1010 may perform a statistical lock on the clock edge in detecting when the sum of delays matches one clock period. Instead of searching for the first control value that the arbiter 950 detects as matching a clock period, the DLL control 1010 can produce a histogram for a selection of the control values. A certain number of attempts are made for each control value and the histogram indicates how many of the attempts the arbiter 950 saw as a match. The value finally chosen by the DLL control 1010 may be the value with the most matches, the first value having at least a certain number of matches, or a value chosen by another computation of the statistical distribution of the histogram.

The established control setting reflects the effects of process, temperature, voltage, etc. on the delays of DMs 1000. Calibration circuit 520 may be operated continuously, periodically, when conditions (temperature, voltage, etc.) change, or according to any of a variety of other strategies.

The same calibration control settings can be distributed to DMs used throughout interface 230, such as DM 712, DM 910, etc. The desired delays of DMs in interface 230 are achieved by selecting a number of programmable delay modules 770 for each such DM which have the same ratio to the total number of delay modules 770 included in all the DMs 1000 as the ratio of the desired delay to the clock period. For example, if there are twenty total delay modules 770 in the sum of DMs 1000, one can select a delay of one tenth of the clock period by using two delay modules 770 for any particular DM used in interface 230. In addition, one can also choose a fractional extra delay for any particular DM by inserting small extra loads at the outputs of selected delay modules 770 which constitute that DM.

The calibration information obtained by calibration circuit 520 may also be used to control other circuit parameters in the face of variable conditions. These other parameters may be for uses unrelated to the factor calibrated by the calibration circuit 520 and may include resistance (e.g., the resistance of termination device 690) and gain (e.g., the gain of amplifier 920). In this way, the single calibration circuit 520 can provide calibration for each of the circuit parameters instead of having calibration controls, e.g., feedback loops, occupying chip area for each of the circuit parameters or consuming other resources such as chip pins, external resistors, or precision voltage references, and the like. This control of other circuit parameters may be done by correlating (leveraging) the information contained in the delay control setting with the effects of process, temperature, voltage, and like conditions on the other circuit parameters. This correlating (leveraging) is described further below.

Although described in the context of calibrating for delay (e.g., for the delay modules 722–728 and 910–916), information may be obtained for any one of the other circuits needing calibration (e.g., amplifiers having a gain such as the amplifiers 920 in the receiver circuit 530 or chips with termination impedance such as the transistors 690) and be leveraged on the other circuit parameters. The selection of which circuit parameter to obtain the information for may be based on the bits of accuracy required for the various circuit parameters, on convenience, on cost, or on other criteria. For example, calibration information can be obtained for the circuit parameter requiring the highest degree of accuracy (e.g., most bits of accuracy) and leveraged for the other circuit parameters. The leveraging process may cause a decrease in the accuracy of the obtained calibration information, and the other circuit parameters are more likely better able to tolerate such a decrease in accuracy.

In this example, seven bits of accuracy were needed to obtain the desired timing accuracy in the delay modules in the face of accepted ranges for variations in process, temperature and voltage. In contrast, only two bits of accuracy were needed for the on-chip impedances and one bit of accuracy was needed for the amplifier gains.

The on-chip impedances used to terminate transmission lines for receivers require only three choices of termination impedance, which translates to approximately two bits of accuracy. Two bits of accuracy are needed despite the additional burden of variations in board trace impedances being matched among all of the chips. This low accuracy is at least partially due to the relative insensitivity of reflection in near matched conditions and the extra immunity to self-induced noise provided by the electromagnetic bus coupling. So while impedance could be calibrated by a comparison with a target impedance, because of the relatively low accuracy requirement for the chips in this setup, the impedance calibration can be piggybacked onto the timing calibration despite the fact that RC circuit delays and device conductances may be only partly and non-trivially related with respect to variations such as process, temperature, and voltage.

Figure 9:
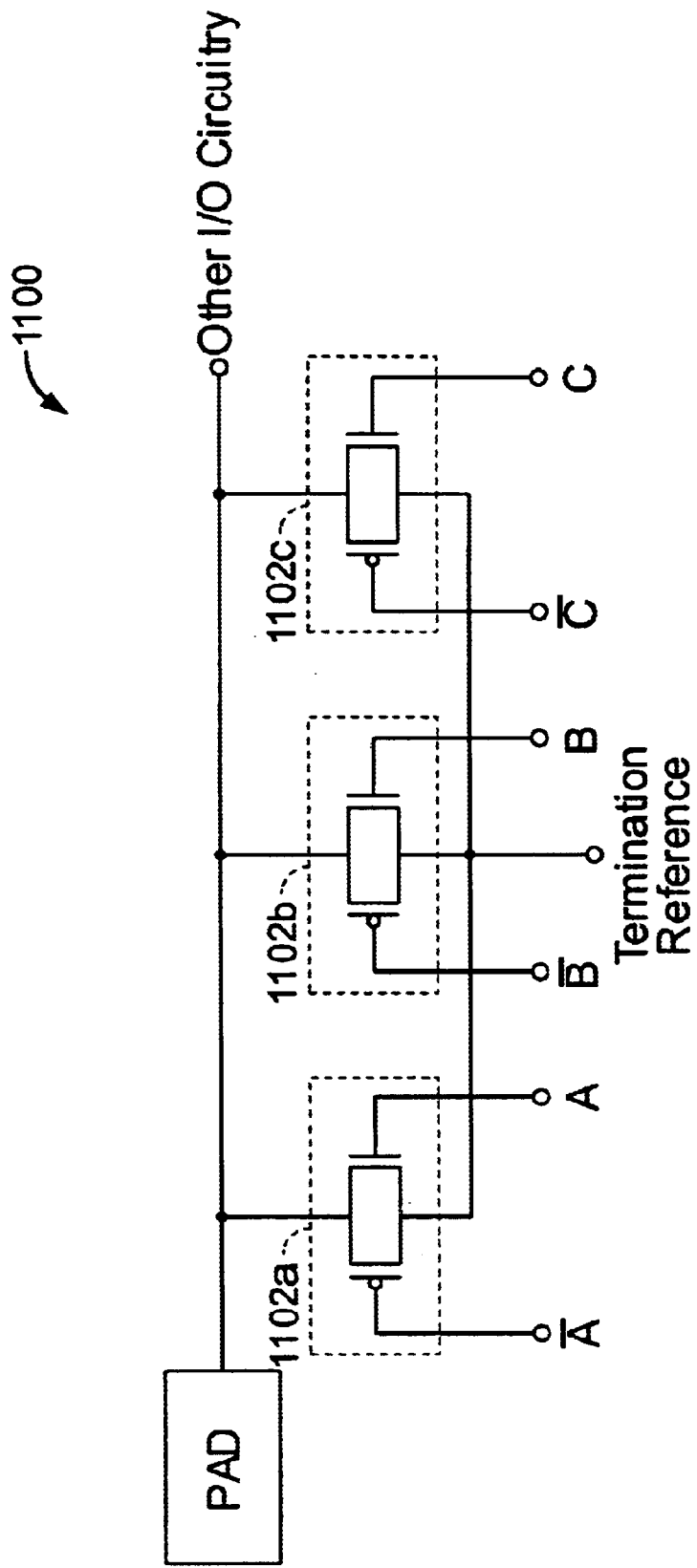
FIG. 9 is a block diagram of a network of termination devices.

FIG. 9 shows an example of a network 1100 of termination devices 1102 that may be used to partition the seven bits of delay values into three broad categories of ranges to activate the three possible choices of termination impedance. Generally, this leveraging is accomplished by examining some of the most significant bits from the delay controls (e.g., examining some of the $p_1$–$p_j$ signals of FIG. 5B). In this example, there are three pairs of N-type and P-type termination devices 1102a, 1102b, and 1102c (generically "termination devices 1102"). Each pair of termination devices 1102 is activated under different states of the delay control bits. The first pair 1102a, controlled by signal A, may be activated if the seven delay bits of control are determined to fall in a "fast" or low-impedance process, temperature, and voltage regime. The second pair 1102b, controlled by signal B, may be additionally activated for "average" corners, while the third pair 1102c may be additionally activated for "slow" corners. In this way, the signals A, B, and C form a thermometer code that can be used to calibrate termination impedance. Note that the appropriate combinations of the termination devices 1102 are only active during reception; all of the devices 1102 are turned off during transmission.

Figure 10:
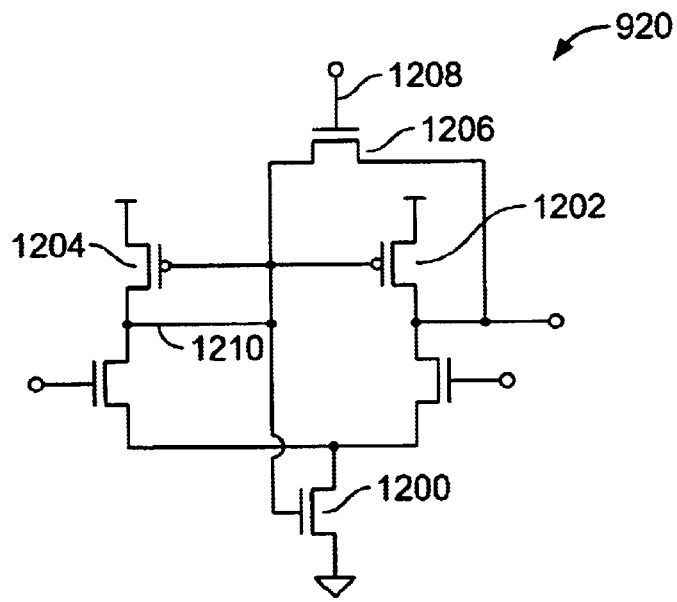
FIG. 10 is a schematic representation of an amplifier.

Turning to calibration of the amplifiers, the one bit of accuracy required for calibration is, as with the impedances, extracted from the most significant bits of the seven bits of the delay controls. FIG. 10 shows a simplified example of the amplifier 920 discussed above with reference to FIG. 7E. In FIG. 10, the self-biasing of the differential amplifier 920 accounts for the effects of temperature, voltage, process, and even P to N device process skew on the biasing of the amplifier 920 relative to other circuits (e.g., the quiescent output voltage of the amplifier 920 relative to the input threshold of any succeeding circuits). This is accomplished with the local analog feedback loop created by the devices 1200, 1202, and 1204 and the signal along bias line 1210. The missing effect is calibration with respect to average circuit speed (e.g., gain bandwidth product). Hitting a gain (or gain bandwidth product) window may be important because the amplifier's gain should be high enough to recover full swing signals but low enough to avoid amplifying residual or unwanted signals such as noise.

The amplifier 920 gets its one bit of accuracy from the delay controls even though the delay controls and the local amplifier feedback account for different factors and despite an only approximate correlation between inverter delay and amplifier gain. Thus, the amplifier 920 mixes exact, local, analog feedback from the devices 1200, 1202, and 1204 and the signal along line 1210 with chip-wide, digital, approximate feedback from device 1206 and the signal along control line 1208. When the speed corner is faster than some threshold, the signal along the control line 1208 is asserted, thereby turning on the device 1206 and reducing the gain of the amplifier 920.

More or less accuracy than the two bits described for the impedance calibration and the one bit described for the amplifier calibration may be leveraged from the seven bits of delay values. (Of course, more than seven bits could not be leveraged from the delay's seven bits of accuracy.)

Similarly, not all factors that need calibration in a system need be leveraged from a single calibration source (e.g., the one calibration circuit 520). Multiple factors may be separately calibrated and any additional factors may be leveraged from any of those multiple factors. In the example described above, delay and impedance may both be separately calibrated, with the amplifier being calibrated based on either one of those calibrations.

Calibrating for one factor and leveraging that calibration to other factors is not limited to the delay, impedance, and gain factors described above. Examples of other factors that may be leveraged from a calculated calibration include current (e.g., a bias or source current), voltage (e.g., a bias or reference), controlled rise-time, and the like.

Furthermore, calibrating for one factor and leveraging that calibration to other factors is not limited to implementation in a multi-drop bus scenario as described above. In any system or circuitry having multiple factors that may be calibrated, one of the factors may be calibrated according to a circuit such as the calibration circuit 520. That calibration may then be leveraged for one or more of the remaining factors using, e.g., a series of termination devices as in the network 1100.

Figure 11:
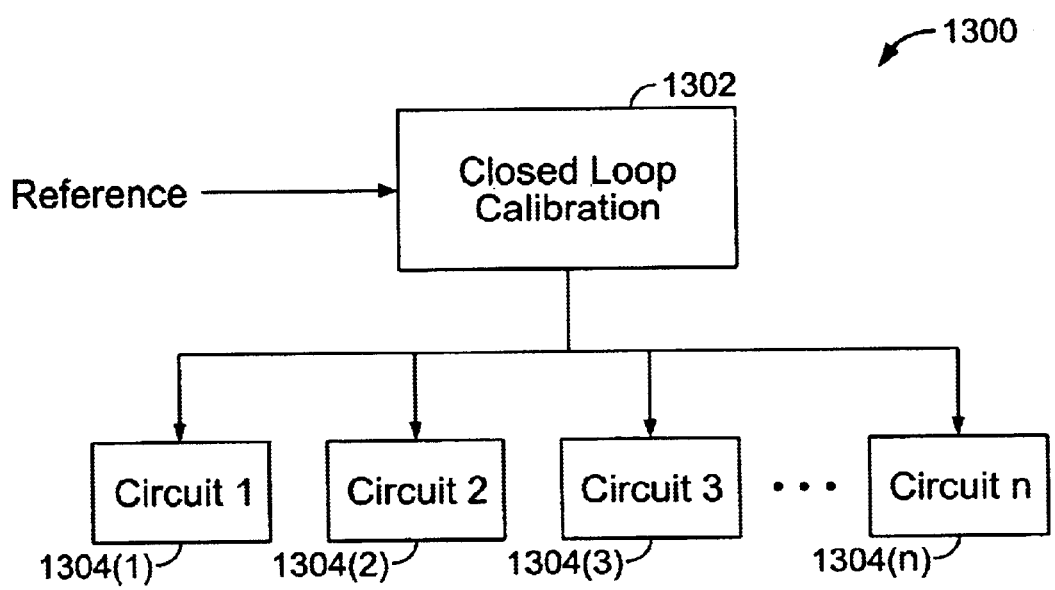
FIG. 11 is a block diagram of a calibration system.

For example, FIG. 11 shows a partial integrated circuit 1300 that can compensate for variations in process, voltage, temperature, and other factors of the integrated circuit 1300 using a closed loop calibration circuit 1302. The closed loop calibration circuit 1302 can create a feedback loop for one of these factors and distribute the results (analog or digital) to other circuits 1304 included in the integrated circuit 1300. These other circuits 1304 can then process the results (e.g., leverage the results using appropriate correlations) to calibrate for other factors.

There has thus been disclosed a mechanism for calibrating systems or circuits, such as in the context of high bandwidth communications in multi-drop bus systems.

Other embodiments are within the scope of the following claims.

What is claimed is:

1. A system comprising:
    a conductive trace;
    a first device to drive onto the conductive trace a first symbol that encodes bits in selected properties of the symbol;
    a second device to recover the bits from the waveform transferred to the second device through an electromagnetic coupler; and
    a test circuit to generate calibration information that indicates how variations in at least one variable impact functionality of a first element of a controlled circuit included in the first device or the second device and using the calibration information to provide control signals to the first element and to at least one other element of the controlled circuit to adjust functionality of the first element and the other element to accommodate variations in the variable.

2. The system of claim 1 in which the first device includes the test circuit.

3. The system of claim 1 in which the second device includes the test circuit.

4. The system of claim 1 in which the first element requires greater accuracy in the control signals than the other element.

5. The system of claim 1 in which the test circuit comprises a test element that is of the same kind as the first element and that is different from the other element.

6. The system of claim 1 in which one of the elements comprises an amplifier, a termination impedance, or a timing generator.

7. The system of claim 1 in which the variable comprises a temperature, a supply voltage, or a fabrication process parameter.

8. A system comprising:
    a conductive trace;
    a first device to drive onto the conductive trace a first symbol that encodes bits in selected properties of the symbol;
    a second device to recover the bits from the waveform transferred to the second device through an electromagnetic coupler; and
    a test circuit to generate calibration information that indicates how variations in at least one variable impact functionality of a first element of a controlled circuit included in the first device or the second device and to provide control signals to the first element and to at least one other element of the controlled circuit to adjust functionality of the first element and the other element to accommodate variations in the variable in which the first element comprises a timing generator that includes a chain of delay elements each including a current starved inverter, and the test circuit comprises a test chain of the delay elements.

9. The system of claim 7 in which the test circuit is part of the integrated circuit.

10. The system of claim 1 in which the first element of the controlled circuit comprises a timing generator, one of the other elements comprises a termination impedance, and another of the other elements comprises an amplifier.

11. The system of claim 1 in which the other element is impacted by fewer of the variables than is the first element.

12. The system of claim 1 in which the other element comprises a termination impedance that has no more than three possible calibration choices.

13. The system of claim 1 in which the controlled circuit comprises part of an integrated circuit.

14. The system of claim 13 in which the integrated circuit comprises a processor, a bus controller, a chip set, or a memory module.

15. The system of claim 1 in which the control signals comprise digital signals.

16. The system of claim 15 in which control signals provided to the first element comprise more bits of accuracy than control signals provided to the other element.

17. The system of claim 15 in which the calibration information is generated as digital signals that are used directly as the control signals.

18. The system of claim 17 in which the digital signals include signals of higher accuracy that are delivered directly to the first element, and derived digital signals of lower accuracy that are delivered directly to the other element.

19. An apparatus comprising:
a delay-locked loop to lock on one of a plurality of values, each of the values indicating a potential clock period, based on an evaluation of a statistical distribution of the values.

20. The apparatus of claim 19 in which the statistical evaluation includes determining which of the values occurs with the most frequency.

21. The apparatus of claim 19 in which the statistical evaluation includes choosing one of the values occurring at least a minimum number of times.

22. The apparatus of claim 19 in which the delay-locked loop is also to provide to a first element of a controlled circuit a control signal, based on the one of the values, that is representative of how changes in at least one variable affects operation of the first element to adjust operation of the first element to accommodate change in the variable, and
to provide a control signal, based on the one of the value, to at least one other element of the controlled circuit to adjust operation of the other element to accommodate changes in the variable.

23. The apparatus of claim 19 further comprising a first circuit to detect the values indicating clock periods.

24. The apparatus of claim 23 in which the detecting includes determining when a sum of delay periods matches a clock period.

25. An apparatus comprising:
a delay-locked loop to generate calibration information that indicates operational dependence of a first element of a controlled circuit on at least one variable; and
output nodes to provide control signals reflecting the calibration information to the first element and to at least one other element of the controlled circuit to adjust operation of the first element and the other element to adjust for changes in the variable.

26. The apparatus of claim 25 in which the first element requires greater accuracy in the control signals than the other element.

27. The apparatus of claim 25 in which the delay-locked loop comprises a test element that is of the same kind as the first element and that is different from the other element.

28. The apparatus of claim 25 in which one of the elements comprises an amplifier, a termination impedance, or a timing generator.

29. The apparatus of claim 25 in which the variable comprises a temperature, a supply voltage, or a fabrication process parameter.

30. The apparatus of claim 25 in which the first element comprises a timing generator that includes a chain of delay elements each including a current starved inverter, and the delay-locked loop comprises a test chain of the delay elements.

31. The apparatus of claim 25 in which the first element of the controlled circuit comprises a timing generator, one of the other elements comprises a termination impedance, and another of the other elements comprises an amplifier.

32. The apparatus of claim 25 in which the other element is affected by fewer of the variables than is the first element.

33. The apparatus of claim 25 in which the other element comprises a termination impedance that has no more than three possible calibration choices.

34. The apparatus of claim 25 in which the controlled circuit comprises part of an integrated circuit.

35. The apparatus of claim 34 in which the integrated circuit comprises a processor, a bus controller, a chip set, or a memory module.

36. The apparatus of claim 34 in which the delay-locked loop is part of the integrated circuit.

37. The apparatus of claim 25 in which the control signals comprise digital signals.

38. The apparatus of claim 37 in which control signals provided to the first element comprise more bits of accuracy than control signals provided to the other element.

39. The apparatus of claim 37 in which the calibration information is generated as digital signals that are used directly as the control signals.

40. The apparatus of claim 39 in which the digital signals include signals of higher accuracy that are delivered directly to the first element, and derived digital signals of lower accuracy that are delivered directly to the other element.

* * * * *